(12) United States Patent
Weibezahn et al.

(10) Patent No.: US 8,816,188 B2
(45) Date of Patent: Aug. 26, 2014

(54) PHOTOVOLTAIC DEVICES WITH ELECTRICALLY COUPLED SUPPORTS

(75) Inventors: Karl S Weibezahn, Corvallis, OR (US); Scott Lerner, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 259 days.

(21) Appl. No.: 13/090,567

(22) Filed: Apr. 20, 2011

(65) Prior Publication Data

US 2012/0266936 A1    Oct. 25, 2012

(51) Int. Cl.
*H01L 31/042* (2014.01)
*H01L 31/052* (2014.01)
*F24J 2/46* (2006.01)
*F24J 2/18* (2006.01)
*F24J 2/52* (2006.01)
*F24J 2/07* (2006.01)

(52) U.S. Cl.
CPC ..... *H01L 31/0422* (2013.01); *F24J 2002/4663* (2013.01); *H01L 31/0521* (2013.01); *H01L 31/0525* (2013.01); *F24J 2/18* (2013.01); *Y02E 10/52* (2013.01); *F24J 2/5235* (2013.01); *F24J 2/07* (2013.01)
USPC .......................... 136/246; 136/244

(58) Field of Classification Search
CPC .................................... H01L 31/052
USPC ................................................. 136/243–265
See application file for complete search history.

(56) References Cited

U.S. PATENT DOCUMENTS

| 5,660,646 | A  | * | 8/1997  | Kataoka et al. | 136/251 |
|-----------|----|---|---------|-----------------|---------|
| 7,259,322 | B2 |   | 8/2007  | Gronet          |         |
| 2006/0231133 | A1 |   | 10/2006 | Fork et al.     |         |
| 2009/0014056 | A1 |   | 1/2009  | Hockaday        |         |
| 2009/0114268 | A1 |   | 5/2009  | Buller et al.   |         |
| 2009/0183762 | A1 |   | 7/2009  | Jackson et al.  |         |
| 2009/0223555 | A1 | * | 9/2009  | Ammar           | 136/246 |
| 2010/0131108 | A1 | * | 5/2010  | Meyer           | 700/275 |
| 2010/0132763 | A1 |   | 6/2010  | Dutta           |         |
| 2010/0282292 | A1 |   | 11/2010 | Malik           |         |

FOREIGN PATENT DOCUMENTS

WO    WO2008054542    *    5/2008

\* cited by examiner

*Primary Examiner* — Jeffrey T Barton
*Assistant Examiner* — Niki Bakhtiari

(57) ABSTRACT

Apparatus and methods related to photovoltaic energy are provided. A device includes electrically conductive supports in electrical contact with one or more photovoltaic cells. The photovoltaic cells are secured with respect to the supports by a clamping force soldering or other means. Optics concentrate and guide photonic energy onto the photovoltaic cells. Generated electrical energy is coupled to a load using the conductive supports. Heat is rejected from the photovoltaic cells using at least one of the supports and a fluid flow, thermal conduction, and so on.

8 Claims, 7 Drawing Sheets

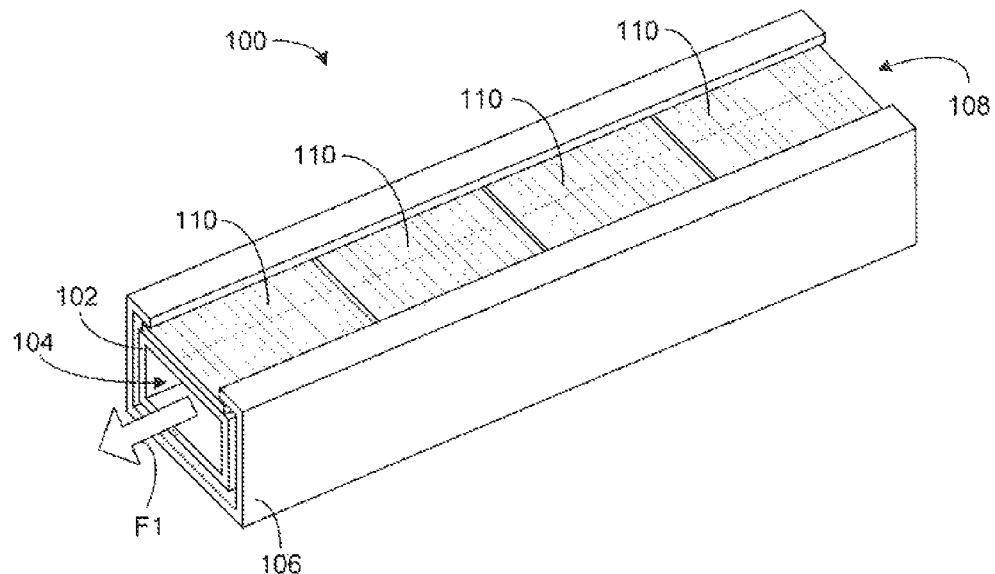
FIG. 1A
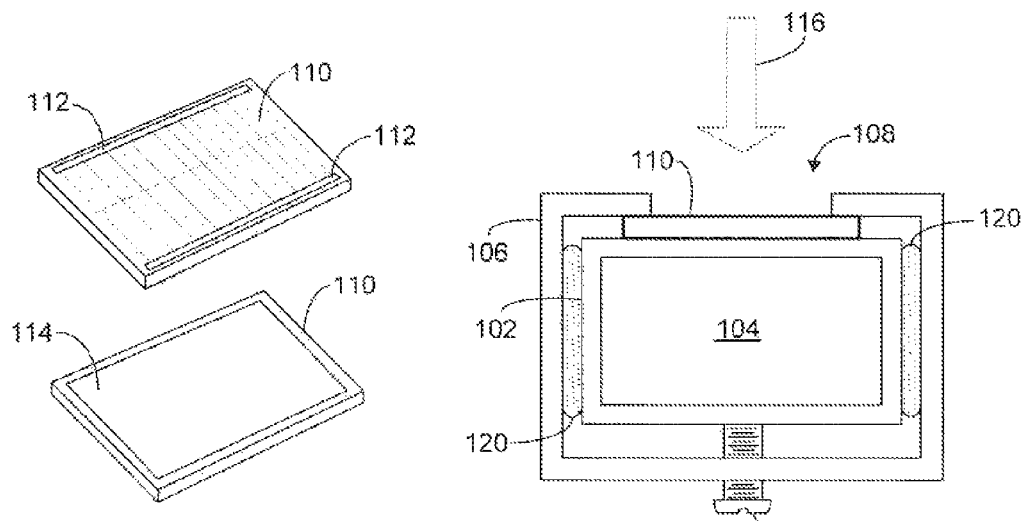
FIG. 1B
FIG. 1C

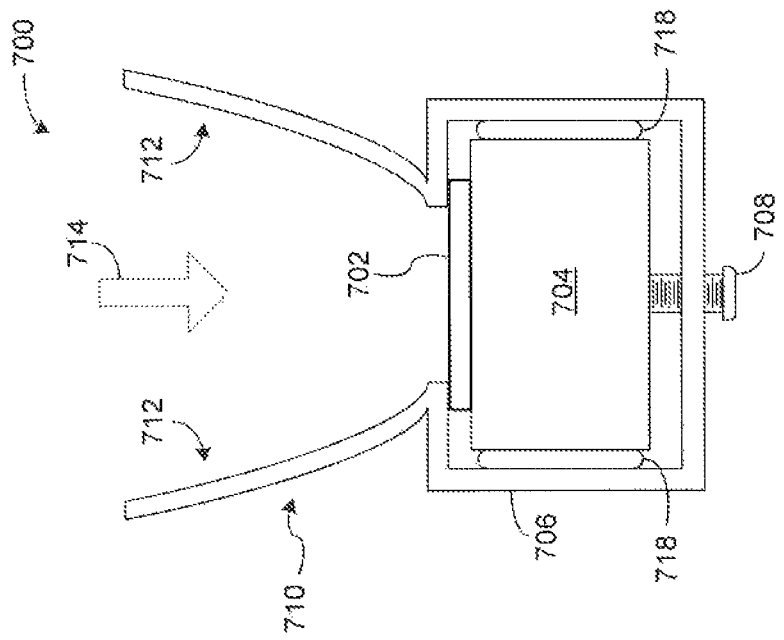
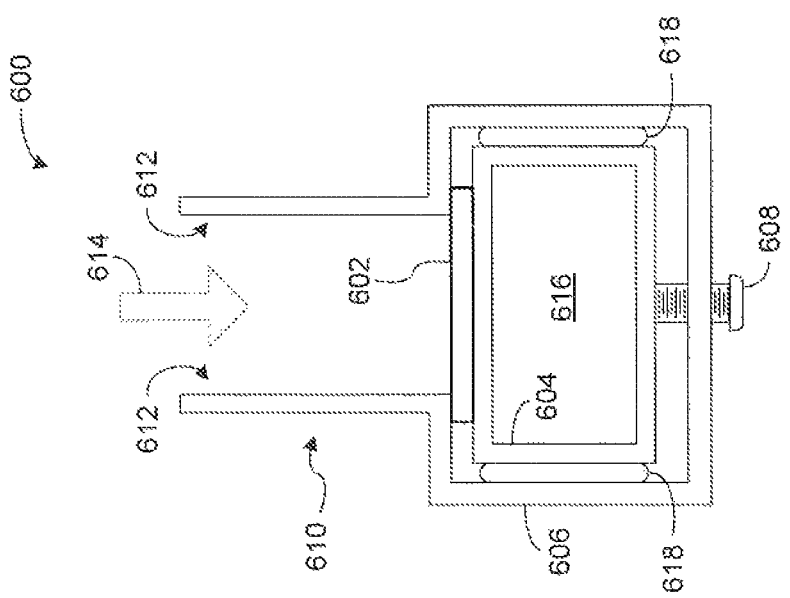

PHOTOVOLTAIC DEVICES WITH ELECTRICALLY COUPLED SUPPORTS

STATEMENT OF GOVERNMENT INTEREST

The invention that is the subject of this patent application was made with Government support under Subcontract No. CW135971, under Prime Contract No. HR0011-07-9-0005, through the Defense Advanced Research Projects Agency (DARPA). The Government has certain rights in this invention.

BACKGROUND

Photovoltaic cells are solid-state devices that directly convert incident photonic energy, such as sunlight, into electrical energy. Improvements to such photovoltaic systems are continuously sought after. The present teachings address the foregoing concerns.

BRIEF DESCRIPTION OF THE DRAWINGS

The present embodiments will now be described, by way of example, with reference to the accompanying drawings, in which:

FIG. 1A depicts an isometric view of a photovoltaic device according to one example of the present teachings;

FIG. 1B depicts an isometric view of aspects of a photovoltaic cell;

FIG. 1C depicts an end elevation view of the photovoltaic device of FIG. 1A;

FIG. 6 depicts and end elevation view of a photovoltaic device according to an example of the present teachings;

FIG. 7 depicts and end elevation view of a photovoltaic device according to an example of the present teachings;

DETAILED DESCRIPTION

Introduction

Figure 2A:
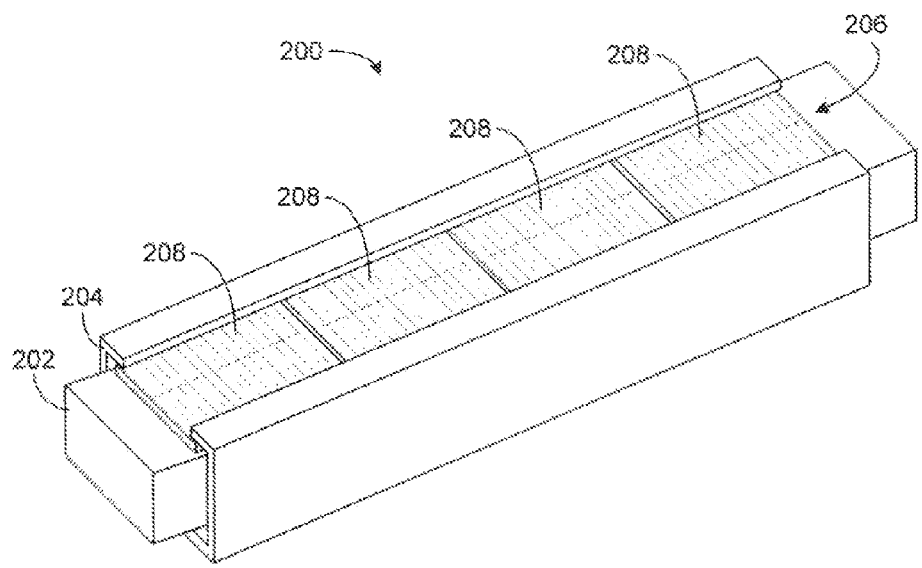
FIG. 2A depicts an isometric view of a photovoltaic device according to another example of the present teachings.

Methods and apparatus related to photovoltaic power systems are provided. A device includes electrically conductive supports in electrical contact with one or more photovoltaic cells. The photovoltaic (PV) cells are secured with respect to the supports by a clamping force, soldering or other electrically conductive means. Primary and secondary optics concentrate and guide photonic energy onto the photovoltaic cells, respectively. Electrical energy generated by the PV cells is coupled to a lead using the conductive supports. Heat is rejected from the photovoltaic cells using at least one of the supports and a fluid flow thermal conduction, or other heat transfer technique.

In one example, a device includes a photovoltaic cell having a first electrode and a second electrode, the first and second electrodes being of respectively opposite electrical polarities. The device also includes a first metallic support electrically coupled to the first electrode. The first metallic support is configured to transfer heat away from the photovoltaic cell. The device further includes a second metallic support electrically coupled to the second electrode.

In another example, a system includes a plurality of photovoltaic cells to convert incident photonic energy into electrical energy. The system also includes a first support electrically coupled to a first electrode of each of the photovoltaic cells. The first support is configured to transfer heat away from the photovoltaic cells by way of a fluid flow through an internal passageway. The system also includes a second support electrically coupled to a second electrode of each of the photovoltaic cells. The system additionally includes a primary optical element to concentrate incident photonic energy. The system further includes a secondary optical element to guide the concentrated photonic energy onto the photovoltaic cells.

In yet another example, a method includes disposing a photovoltaic cell in clamped relationship with a first support and a second support. The first and second supports are electrically coupled to respective electrodes of the photovoltaic cell. The method also includes concentrating photonic energy onto the photovoltaic cell by way of a first optical element and a second optical element so as to generate electrical energy. The method also includes providing the electrical energy to a load by way of the first and second supports. The method further includes transferring heat away from the photovoltaic cells by way of at least the first support.

First Illustrative Device

Reference is now directed to FIGS. 1A, 1B and 1C, which collectively depict various aspects of a device 100. Specifically, FIG. 1A is an isometric view of an assembled device 100. FIG. 1B is an isometric view of top and bottom sides of a photovoltaic cell of the device 100. FIG. 1C is an end elevation view of the device 100. The device 100 is illustrative and non-limiting in nature. Thus, other devices, apparatus and systems are contemplated by the present teachings. The device 100 is also referred to as a photovoltaic device 100 for purposes herein.

The device 100 includes a support 102. The support 102 is formed from an electrically conductive material such as metal. Non-limiting examples of such materials include aluminum, brass, copper, and so on. Each support 102 can also have one or more areas selectively plated using gold, and so on. The support 102 is also defined by a thermally conductive characteristic in accordance with the material from which it is formed. The support 102 is in the form of an elongated conduit having a rectangular cross-sectional shape. The support 102 thus defines an internal fluid passageway 104 through the length thereof. Other supports having other cross-sectional shapes can also be used. The support 102 is also referred to as a first support 102 or first metallic support 102 for purposes herein.

The device 100 includes a support 106. The support 106 is also formed from an electrically conductive material such as aluminum, brass, copper, and so on. Each support 106 can also have one or more areas selectively plated using gold, and so on. The support 106 is also defined by a thermally conductive characteristic accordingly. The support 106 is in the form of an elongated channel having a generally rectangular cross-section. The support 106 is further defined by an aperture (i.e., slot or "window") 108 that extends along the length of the support 106. The support 106 is also referred to as a second support 106 or second metallic support 106 for purposes herein.

The device 100 also includes a plurality of photovoltaic (PV) cells 110. Each of the PV cells 110 is defined by a pair of top electrodes 112 of a first electrical polarity (e.g., positive). Each of the PV cells 110 is also defined by a bottom electrode 114 of a second electrical polarity (e.g., negative) opposite to the first polarity. Each of the PV cells 110 is configured to generate electrical energy in response to incident light. That is, each PV cell 110 directly converts incident photonic energy 116 into electrical energy. In one example, each PV cell 110 is defined by a gallium-arsenide (GaAs), two-junction type available from Emcore Corporation, Albuquerque, N. Mex., USA. Other PV cell types can also be used.

All of the PV cells 110 are held in place with respect to the supports 102 and 106 by way of a clamping force supplied by one or more jack screws 118. Each jack screw 118 is formed from an electrically non-conductive material such as, for non-limiting example, plastic, and so on. Each jack screw 118 is treadably received within a corresponding aperture or bore of the second support 106 and can be rotatably driven in to and out of force contact with the first support 102. In one example, each jack screw 118 is defined by an M2×0.4 size, nylon screw with pan-head, available from McMaster-Carr, Santa Fe Springs, Calif., USA. Other jack screw types can also be used.

Thus, each PV cell 110 is held in a removably fixed position within the device 100, having its electrodes 112 in electrical contact with (or coupled to) the metallic support 106 and its electrode 114 in electrical contact (or coupling) with the metallic support 102. The supports 102 and 106 therefore act as electrical buss-bars of respectively opposite polarities, the PV cells 110 being electrically coupled in parallel circuit relationship with one another.

The PV cells 110 are disposed within the device 100 so as to receive incident photonic energy (i.e., sunlight) through the aperture 108 of the second support 106. Additionally, it is noted that the first support 102 is disposed or received within the second support 106. The device 100 also includes respective isolators 120 that separate the first support 102 from the second support 106. The isolators 120 are formed from electrically non-conductive material such as plastic, phenolic, fiberglass, and so on. In one example, each isolator 120 is formed from a strip of zero-point-zero-one-five inch thick nylon sheet material, available from McMaster-Carr, Santa Fe Springs, Calif., USA.

In one example, each of the isolators 120 has a compliant characteristic so as to exert an expansion force against the respective portions of the supports 102 and 106 that it is in contact with. It is noted that the first support 102 does not make direct electrical contact with the second support 106 by virtue of the jack screw(s) 118 and the isolators 120.

Normal, illustrative operations involving the device 100 are as follows: several PV cells 110 are disposed in resting, electrically-conductive contact with the first support 102. Specifically, the PV cells 110 are arranged in end-to-end orientation along a lengthwise aspect of the first support 102, having their respective electrodes 114 in electrical contact therewith.

The second support 106 is then disposed about the first support 102 such that the PV cells 110 face outward through the aperture 108. Two respective isolators 120 are inserted or disposed on opposite sides of the first support 102 so as to separate it from the second support 106. The first support 102 is thus generally laterally centered within the second support 106.

One or more jack screws 118 are then manipulated (i.e., tightened) so as to drive the first support 102 toward the second support 106 in the direction of the aperture 108. The PV cells 110 are thus mechanically clamped between the first support 102 and the second support 106. The PV cells 110 are, also in electrical contact with the first and second supports 102 and 106, respectively. However, the first and second supports 102 and 106 are isolated against direct electrical contact with each other by virtue of the PV cells 110 and the jack screws 118 and the isolators 120.

Photonic energy 116 is then incident upon the PV cells 110. In turn, the PV cells generate electrical energy that is directly coupled to the first support 102 by way of the electrodes 114, and to the second support 106 by way of the electrodes 112, respectively. The electrical energy generated by the PV cells 110 can be coupled to an electrical load (e.g., 818 of FIG. 8) or used in some other suitable way.

Heat is transferred away from the PV cells 110 by way of a fluid flow "F1" through the internal passageway 104 of the first support 102. Such a fluid flow can be, for non-limiting example, a forced flow of ambient air, cooled air, nitrogen gas, a liquid such as de-ionized water, and so on. Other suitable heat-transfer fluids (liquid or gas) can also be used. Thus, heat is rejected from the PV cells 110 by way of thermal conduction through the first support 102 and convective heat transfer to the fluid flow F1.

In the illustrative example above, the PV cells 110 are held in place by clamping force between the respective supports 102 and 106. The PV cells 110 can be removed for repair or replacement by disassembling the first support 102 from the second support 106. Specifically; the jack screws 118 can be manipulated (loosened) so as to allow the first support 102 to be slidably removed from the second support 106, enabling individual or collective removal or replacement of the PV cells 110.

In another example, some or all of the PV cells 110 can be held in place by soldering the respective electrodes 114 to the first support 102. In yet another example, the PV cells 110 are held in place by soldering the respective electrodes 112 to the second support 106. Such soldering can be done using solder paste that is then reflowed by way of brief hot-bar contact with the corresponding support. Other suitable, electrically conductive bonding methods can also be used. The apparatus 100 includes a total of four PV cells 110 in the interest of clarity. However, it is to be understood that other devices and apparatus can include any suitable number of PV cells in accordance with the present teachings.

Table 1 below includes illustrative and non-limiting characteristics for a photovoltaic device 100. Other devices having respectively varying dimensions, characteristics or constituencies are also contemplated by the present teachings.

TABLE 1

Illustrative Device 100

| Feature | Characteristics | Notes |
|---|---|---|
| Support 102 | 4.8 mm × 4.8 mm × 100 mm | Brass |
| Support 106 | 6.4 mm × 6.4 mm × 100 mm | Brass |
| PV Cells 110 | Photodiode - GaAs - 2 Junc. | Emcore Corp. |
| Jack Screws 118 | M2 × 0.4 - Nylon - 6/6 | McMaster-Carr |
| Isolators 120 | 0.015 in - Nylon - 6/6 | McMaster-Carr |

Second Illustrative Device

Figure 2B:
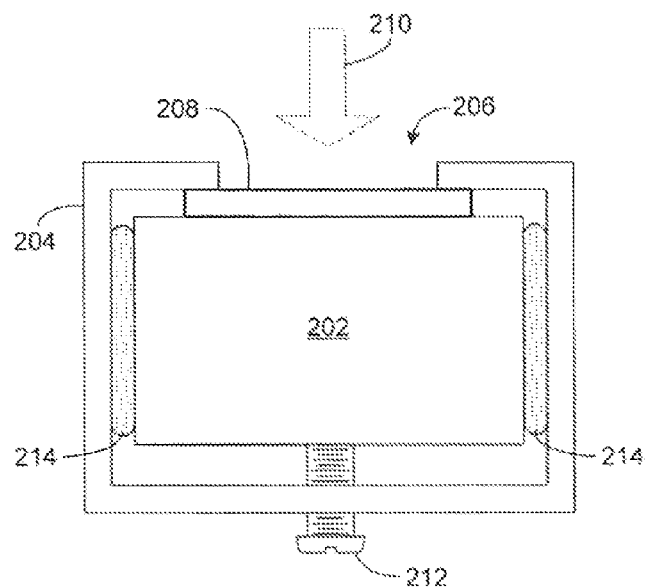
FIG. 2B depicts an end elevation view of the photovoltaic device of FIG. 2A.

Reference is now directed to FIGS. 2A and 2B, which collectively depict various aspects of a device 200. Specifically, FIG. 2A is an isometric view of an assembled device 200. FIG. 2B is an end elevation view of the device 200. The device 200 is illustrative and non-limiting in nature. Thus, other devices, apparatus and systems are contemplated by the present teachings. The device 200 is also referred to as a photovoltaic device 200 for purposes herein.

The device 200 includes a support 202. The support 202 is formed from an electrically conductive material such as metal. Non-limiting examples of such materials include aluminum, brass, copper, and so on. Each support 202 can also have one or more areas selectively plated using gold, and so on. The support 202 is also defined by a thermally conductive characteristic in accordance with the material from which it is formed. The support 202 is in the form of solid, elongated bar having a rectangular cross-sectional shape. Other suitable shapes can also be used. The support 202 is also referred to as a first support 202 or first metallic support 202 for purposes herein.

The device 200 includes a support 204. The support 204 is also formed from an electrically conductive material such as aluminum, brass, copper, gold, and so on. The support 204 is also defined by a thermally conductive characteristic accordingly. The support 204 is in the form of an elongated channel having a generally rectangular cross-section. The support 204 is further defined by an aperture (i.e., slot or "window") 206 that extends along the length of the support 204. The support 204 is also referred to as a second support 204 or second metallic support 204 for purposes herein.

The device 200 also includes a plurality of photovoltaic (PV) cells 208. In one example, each PV cell 208 is substantially equivalent to the PV cell(s) 110 described above. Thus, each PV cell 208 is defined by a pair of top electrodes (e.g., 112) and by a bottom electrode (e.g., 114) of respectively opposite polarities. Each of the PV cells 208 is configured to directly convert incident photonic energy 210 into electrical energy.

All of the PV cells 208 are held in place with respect to the supports 202 and 204 by way of a clamping force supplied by one or more jack screws 212. Each jack, screw 212 is formed from an electrically non-conductive material such as, for non-limiting example, plastic, and so on. Thus, each PV cell 208 is held in a removably fixed position within the device 200, having respective electrodes in electrical contact with (or coupled to) the metallic supports 202 and 204. The supports 202 and 204 therefore act as electrical buss-bars of respectively opposite polarities having the PV cells 208 electrically coupled in parallel circuit relationship with each other.

The PV cells 208 are disposed within the device 200 so as to receive incident photonic energy (i.e., sunlight) through the aperture 206 of the second support 204. Also, the first support 202 is disposed or received within the second support 204. The device 200 also includes respective isolators 214 that separate the first support 202 from the second support 204. The isolators 214 are formed from electrically non-conductive material such as plastic, phenolic, fiberglass, and so on. In one example, each isolator 214 has a compliant characteristic so as to exert an expansion force against the respective portions of the supports 202 and 204 that it is in contact with. The first support 202 does not make direct electrical contact with the second support 204 by virtue of the jack screw(s) 212 and the isolators 214.

Normal, illustrative operations involving the device 200 are as follows several PV cells 208 are disposed in resting, electrically-conductive contact with the first support 202. Specifically, the PV cells 208 are arranged in end-to-end orientation along a lengthwise aspect of the first support 202 having their respective electrodes in electrical contact therewith.

The second support 204 is then disposed about the first support 202 such that the PV cells 208 face outward through the aperture 206. Two respective isolators 214 are inserted or disposed on opposite sides of the first support 202 so as to separate it from the second support 204. The first support 202 is thus (about) laterally centered within the second support 204. It is noted that the first support 202 extends outward beyond the ends of the second support 204. The first support 202 is thus configured to be electrically, mechanically or thermally mated to another apparatus or entity.

One or more jack screws 212 are then manipulated (i.e., tightened) so as to drive the first support 202 toward the second support 204 in the direction of the aperture 206. The PV cells 208 are therefore clamped between the first support 202 and the second support 204 and are in electrical contact therewith, respectively. However, the first and second supports 202 and 204 are isolated against direct electrical contact with each other.

Photonic energy 210 is then incident upon the PV cells 208. The PV cells 208 respond by generating electrical energy that is directly coupled to the first support 202 and to the second support 204 by way of respective electrodes (e.g., 114 and 112). The electrical energy generated by the PV cells 208 can be coupled to an electrical load (e.g., 818) or used in some other suitable way.

Heat is transferred way from the PV cells 208 by way of a thermal conduction through the first support 202. The first support 202 can be in contact with a heat sink, thermal fin assembly, a source of chilled media or other heat transfer device or apparatus. In the illustrative, example above, the PV cells 208 are held in, place by clamping force between the respective supports 202 and 205. In another example, some or all of the PV cells 208 are held in place by soldering the respective electrodes (e.g., 114) to the first support 202. In another example, the PV cells 208 are held in place by soldering the respective electrodes (e.g., 112) to the second support 204. Such soldering can be done using reflowed solder paste or another suitable, electrically conductive adhesive or bonding method.

Third Illustrative Device

Figure 3:
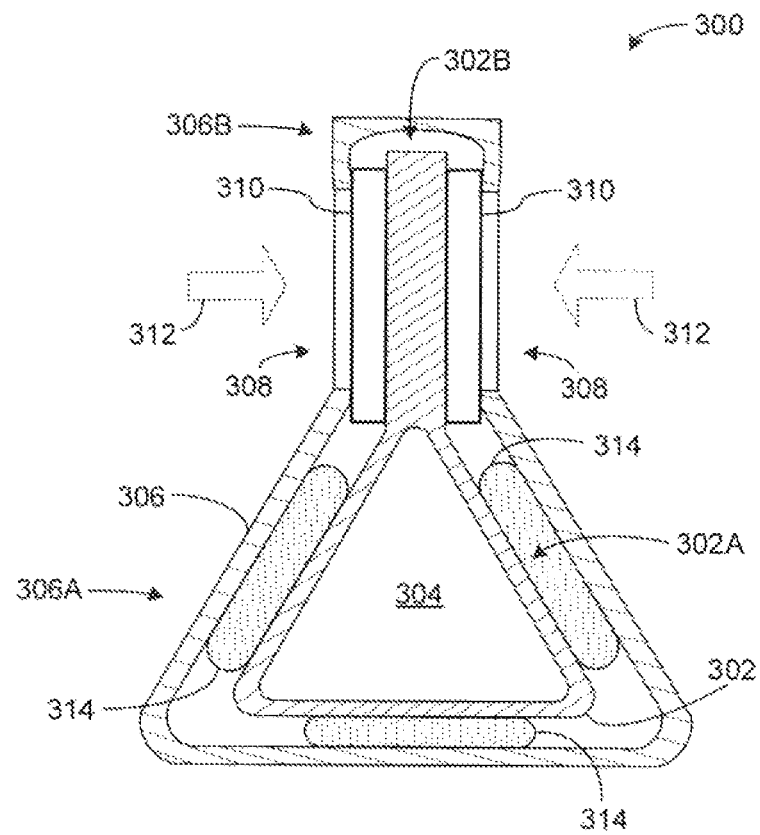
FIG. 3 depicts and end elevation sectional view of a photovoltaic device according to yet another example of the present teachings.

Reference is now directed to FIG. 3, which depicts a device 300. Specifically, FIG. 3 is an end elevation sectional view of a device 300. The device 300 is illustrative and non-limiting in nature. Thus, other devices, apparatus and systems are contemplated by the present teachings. The device 300 is also referred to as a photovoltaic device 300 for purposes herein.

The device 300 includes a support 302. The support 302 is formed from an electrically conductive material such aluminum, brass, copper, and so on. The support 302 can also include one or more areas plated in gold, and so on. Other materials can also be used. The support 302 can be formed by machining a solid material, or formed from sheet material that is bent or folded into the corresponding configuration. Other forming techniques can also be used.

The support 302 is also defined by a thermally conductive characteristic in, accordance with the material from which it is formed. The support 302 is in the form of an elongated conduit 302A having a generally triangular cross-sectional shape and including a bar-like extension portion 302B. The support 302 thus defines an internal passageway 304 throughout the length thereof. The support 302 is also referred to as a first support 302 or first metallic support 302 for purposes, herein. In one example, the internal passageway 304 extends into a central void (not shown) of the bar-like extension portion 302B.

The device 300 includes a support 306. The support 306 is also formed from an electrically conductive material such as aluminum, brass, copper, gold, and so on. The support 306 is also defined by a thermally conductive characteristic accordingly. The support 306 can be formed by machining a solid material, or formed from sheet material that is bent or folded into the corresponding configuration. Other forming techniques can also be used.

The support 306 is in the form of an elongated channel having a generally triangular cross-sectional portion 306A and a rectangular cross-sectional portion 360B. The support 306 is further defined by a pair of apertures (i.e., slots or "windows") 308 that extend along a portion (or the majority) of the length of the support 306. The support 306 is also referred to as a second support 306 or second metallic support 306 for purposes herein.

The device 300 also includes a plurality of photovoltaic (PV) cells 310. Each of the PV cells 310 is defined by a pair of top electrodes (e.g., 112) and a bottom electrode (e.g., 114) of respectively opposite polarities. Each of the PV cells 310 is configured to generate electrical energy in response to incident light.

All of the PV cells 310 are held in place with respect to the supports 302 and 306 by way of a clamping force or compression by way of the placement, forming or folding of the of second support 306 about the first support 302. The device 300 also includes a plurality of isolators 314 disposed so as to separate the first support 302 against direct contact with the second support 306. The isolators 314 are formed from electrically non-conductive material such as plastic, phenolic, fiberglass; and so on. In one example, each of the isolators 314 has a compliant characteristic so as to exert an expansion force against the respective portions of the supports 302 and 306 that it is in contact with.

Each PV cell 310 is held in a removably fixed position within the device 300, having one or more electrodes in electrical contact with (or coupled to) the first support 302 and one or more opposite electrodes in electrical contact (coupling) with the second support 306. The supports 302 and 306 thus act as electrical buss-bars of respectively opposite polarities, having the PV cells 310 electrically coupled in parallel circuit relationship with each other.

The PV cells 310 are disposed within the device 300 so as to receive incident photonic energy (i.e., sunlight) through the aperture 308 of the second support 306. The first support 302 is, disposed or received within the second support 306.

Normal, illustrative operations involving the device 300 are generally consistent with those described above in regard to the device 100. In particular, photonic energy 312 is incident upon the PV cells 310. In turn, the PV cells 310 generate electrical energy that is directly coupled to the first support 302 and to the second support 306, respectively. The electrical energy generated by the PV cells 310 can be coupled to an electrical load (e.g., 818) or used in some other suitable way.

Heat is transferred way from the PV cells 310 by way of a fluid flow (e.g., F1) through the internal passageway 304 of the first support 302. Such a fluid flow can be, for non-limiting example, ambient air, cooled air, nitrogen gas, de-ionized water, and so on. Other suitable heat-transfer fluids (liquid or gas) can also be used. Thus, heat is rejected from the PV cells 310 by way of thermal conduction through the first support 302 and convective heat transfer to the fluid flow.

In the illustrative example above, the PV cells 110 are held in place by clamping force between the respective supports 302 and 306. The PV cells 310 can be removed for repair or replacement by disassembling the first support 302 from the second support 306. In another example, some or all of the PV cells 310 can be held in place by soldering the respective electrodes (e.g., 114) to the first support 302. In yet another example, the PV cells 310 are held in place by soldering the respective electrodes (e.g., 312) to the second support 306.

The apparatus 300 includes a total of four PV cells 310 in the interest of clarity. However, it is to be understood that other devices and apparatus can include any suitable number of PV cells in accordance with the present teachings.

Fourth Illustrative Device

Figure 4:
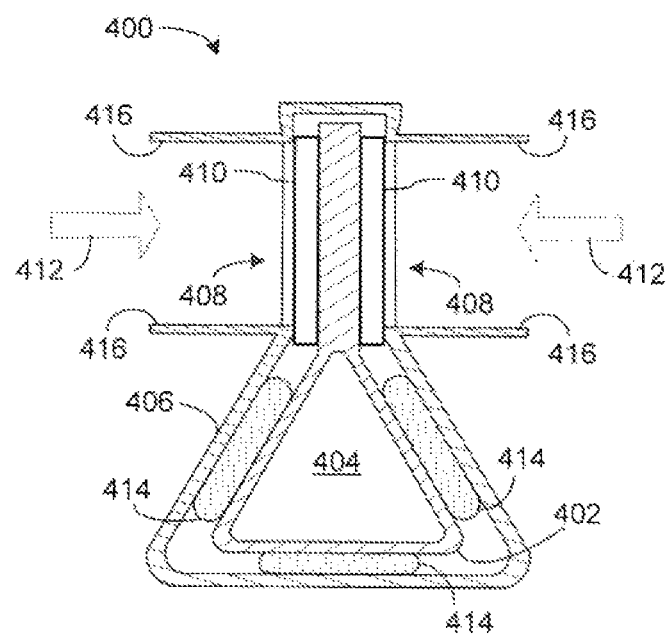
FIG. 4 depicts and end elevation sectional view of a photovoltaic device according to an example of the present teachings.

Reference is now directed to FIG. 4, which depicts a device 400. Specifically, FIG. 4 is an end elevation sectional view of a device 400. The device 400 is illustrative and non-limiting in nature. Thus, other devices, apparatus, and systems are contemplated by the present teachings. The device 400 is also referred to as a photovoltaic device 400 for purposes herein. The device 400 is substantially equivalent to the device 300 above except as described below.

The device 400 includes first support 402 defining an internal fluid passageway 404; a second support 406 defining by a pair of apertures or windows 408, and a plurality of PV cells 410 facing outward through the respective apertures 408. The PV cells 410 are disposed so to receive incident photonic energy 412 through the apertures 408. In turn, electrical energy generated by the PV cells 410 is electrically coupled to the first and second supports 402 and 406, respectively. A plurality of non-conductive Isolators 414 separates the first support 402 against direct contact with the second support 406.

The device 400 also includes respective optics or elements 416. Each of the optics 416 is also referred to as a secondary optic 416 for purposes herein and as will be described below. Each of the optics 416 is defined by an extension away from the second support 406 and having a reflective coating or surface treatment such that photonic energy (i.e., light rays) 412 is directed or guided onto the respective PV cells 410. Thus, the optics 416 operate to guide or concentrate photonic energy 412 that might otherwise by lost onto the PV cells 410. Normal, illustrative operations involving the device 400 are essentially the same as those described above in regard to the device 300, with the addition of the light guiding operation of the secondary optics 416;

First Illustrative System

Figure 5:
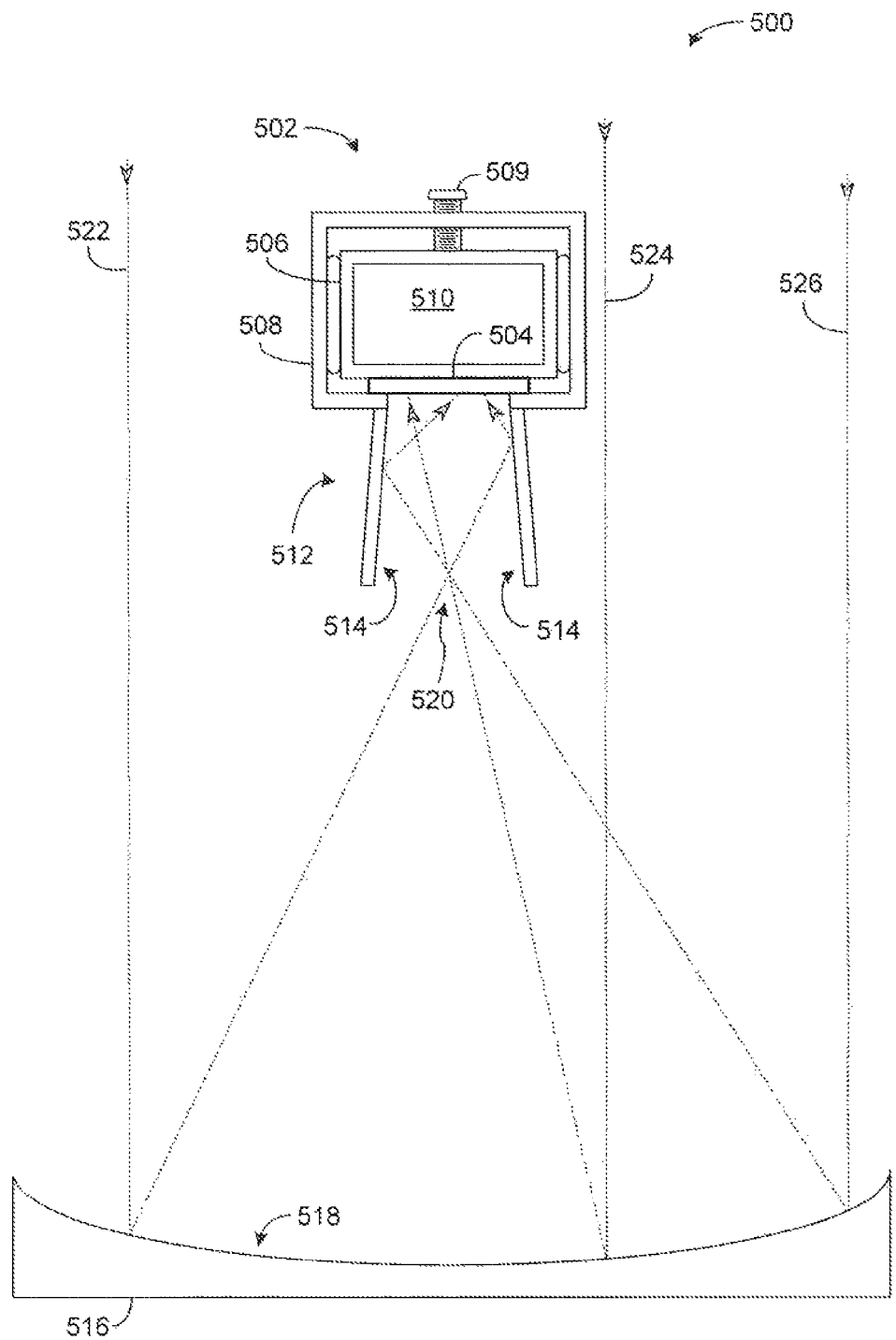
FIG. 5 depicts a schematic view of a system according to the present teachings.

Attention is now turned to FIG. 5, which depicts an end elevation view of a system 500 in accordance with the present teachings. The system 500 is illustrative and non-limiting with respect to the present teachings. Other systems, devices and apparatus can be used according to the present teachings.

The system 500 includes a photovoltaic (PV) device 502. The device 502 is substantially equivalent to the photovoltaic device 100 except as described below. The PV device 502 is configured to provide electrical energy in response to concentrated photonic energy incident thereupon. In particular, the PV device 502 includes a plurality of PV cells 504 supported by way of first and second electrically conductive supports 506 and 508, respectively. The PV cells 504 are clamped in place by way of one or more jack screws 509. The PV cells 504 are in electrical communication with the first and second supports 506 and 508. The PV device 504 is also configured to reject heat away from the PV cells 504 by way of fluid flow through an internal passageway 510 of the first support 506.

The PV device 502 also includes a secondary optic 512. The secondary optic 512 is defined by extensions of the second support 508 having a reflective surface treatment 514. The secondary optic 512 is also defined by a flared or funnel-like shape such that photonic energy is guided onto the PV cells 504.

The system 500 also includes a primary optic 516. The primary optic 516 is defined by a surface having a parabolic cross-sectional shape and bearing a reflective or dichroic surface treatment 518. The primary optic can be formed from metal, glass, thermoplastic, plastic, and so on. Other suitable materials can also be used. The primary optic 516 functions to concentrate photonic energy toward a focal line or region 520. The concentrating effect of the primary optic 516 is depicted by three illustrative light rays 522, 524 and 526, respectively, in the interest of clarity.

Normal, illustrative operations of the system 500 are generally as follows: photonic energy, such as sunlight, is incident upon the primary optic 516. Such photonic energy is depicted by respective rays 522-526, which strike the primary optic 516 at respective angles of incidence. The photonic energy is then concentrated or focused toward a line or region 520.

Concentrated photonic energy disperses as it passes through the focal line 520 before entering the secondary optic 512. Internal reflections off the surface treatment 514 of the secondary optic 512 guide or direct the concentrated photonic energy onto the PV cells 504 of the photovoltaic device 502.

Electrical energy is generated by direct conversion by the PV cells 504 and is electrically coupled to the first support 506 and the second support 508, respectively. This electrical energy can then be coupled to an electrical load (e.g., 818) by way of buss-bar behavior of the first and second supports 506 and 508.

A flow of fluid coolant such as air, nitrogen gas, or other flows through the internal passageway 510 of the first support 506. Heat is transferred from the PV cells 504 to this fluid flow (e.g., F1) by way of conduction and convention and is rejected. Sustained operation of the system 500 is thus contemplated by the present teachings.

Fifth Illustrative Device

Reference is made now to FIG. 6, which depicts an end elevation view of a photovoltaic device (device) 600 according to the present teachings. The device 600 is illustrative and non-limiting with respect to the present teachings. Other devices, apparatus and systems can also be defined, configured and used.

The device 600 includes a plurality of PV cells 602 arranged as a row and held in place by a clamping force between a first support 604 and a second support 606. The first and second supports 604 and 606 are each formed from an electrically conductive material such as copper, brass, aluminum, and so on. Other materials can also be used. The clamping force is removably applied by way of one or more non-conductive jack screws 608.

The second support 606 includes a pair of extensions defining an optic (or optical guide) 610 having a reflective surface treatment 612 thereon. The optic 610 is configured to guide concentrated photonic energy (i.e., concentrated sunlight) 614 onto the PV cells 602. The optic 612 is defined by a rectangular cross-sectional shape or throat. Individual isolators 618 are disposed to prevent direct contact between the first support 604 and the second support 606. The isolators 618 are formed from electrically non-conductive material such as plastic, phenolic, fiberglass, and so on. Other suitable materials can also be used.

Heat is rejected from the PV cells 602 by way of a fluid flow (e.g., F1) through an, internal passageway 616, of the first support 604. In turn, electrical energy generated by the PV cells 602 is electrically coupled to the first and second supports 604 and 606, respectively, by way of direct contact.

Sixth Illustrative Device

Reference is made now to FIG. 7, which depicts an end elevation view of a photovoltaic device (device) 700 according to the present teachings. The device 700 is illustrative and non-limiting with respect to the present teachings. Other devices, apparatus and systems can also be, defined, configured and used.

The device 700 includes a plurality of PV cells 702 arranged as a row and held in place by a clamping force between a first support 704 and a second support 706. The first and second supports 704 and 706 are each formed from an electrically conductive material such as copper, brass, aluminum, and so on. Other materials can also be used. The clamping force is removably applied by way of one or more non-conductive jack screws 708.

The second support 706 includes a pair of extensions defining an optic (or optical guide) 710 having a reflective surface treatment 712 thereon. The optic 710 is configured to guide concentrated photonic energy (i.e.; concentrated sunlight) 714 onto the PV cells 702. The optic 712 is defined by a parabolic or pseudo-parabolic cross-sectional shape or throat. Individual isolators 718 are disposed to prevent direct contact between the first support 704 and the second support 706. The isolators 718 are formed from electrically non-conductive material such as plastic, phenolic, fiberglass, and so on. Other suitable materials can also be used.

Heat is rejected from the PV cells 702 by way of thermal conduction along the first support 704. Heat sinks (not shown) or other constructs can also be coupled to the first support 704 and assist in the heat rejection operation. In turn, electrical energy-generated by the PV cells 702 is electrically coupled to the first and second supports 704 and 706, respectively, by way of direct contact.

Illustrative System Block Diagram

Figure 8:
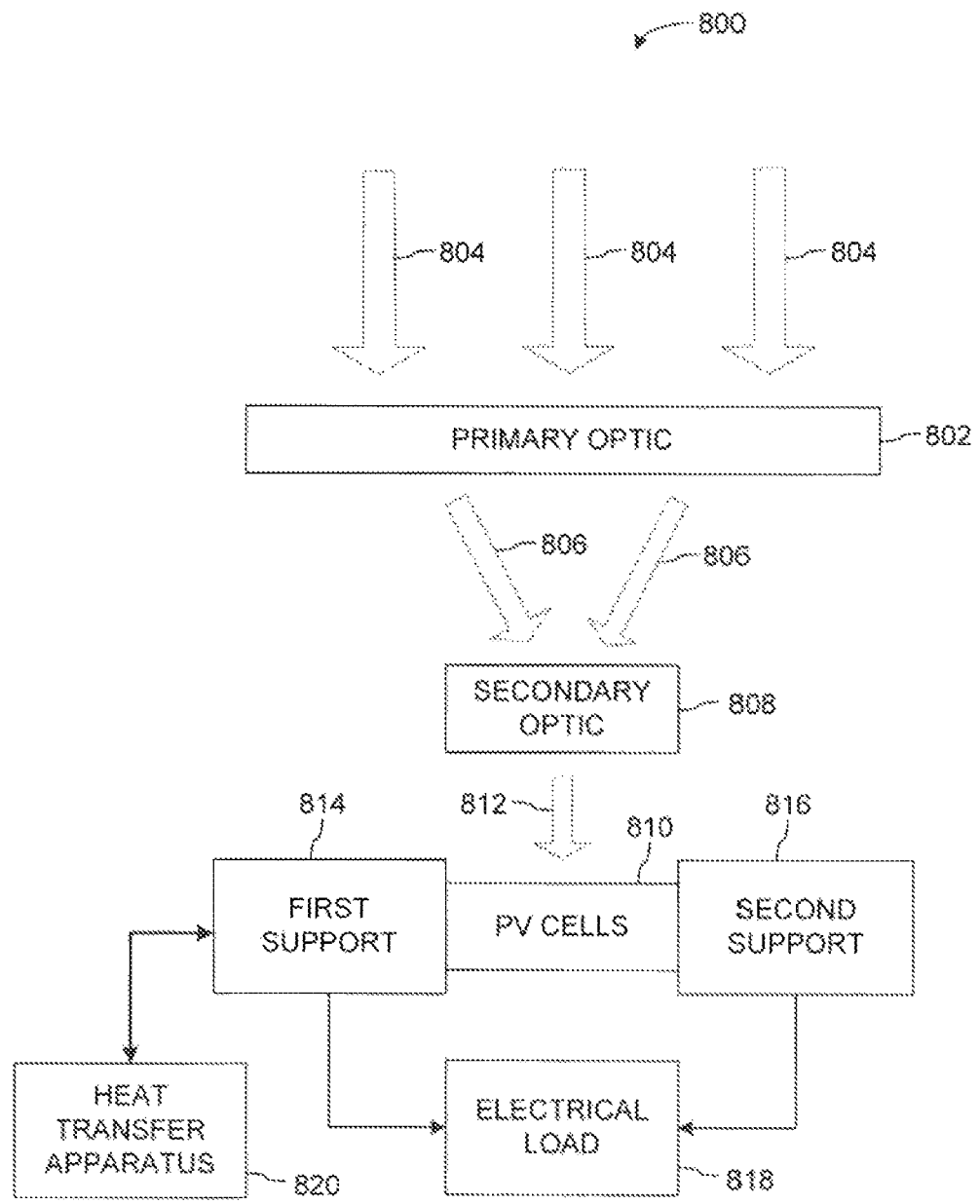
FIG. 8 depicts a block diagram of a system according to another example of the present teachings.

Attention is now directed to FIG. 8, which depicts a block diagram of a system 800 according to the present teachings. The system 800 is illustrative and non-limiting in nature, and other systems, devices and apparatus can be defined and used according to the present teachings.

The system 800 includes a primary optic 802. The primary optic 802 is configured to receive incident photonic energy 804 such as sunlight and to concentrate or focus at least a portion 806 of the spectral content toward a line or region in space. The primary optic 802 can be formed from any suitable material such as metal, glass, plastic, thermoplastic, and so on, and can bear any suitable reflective or dichroic surface treatment. In one example, the primary optic 802 is defined by a parabolic trough formed from thermoplastic and bearing a reflective aluminum surface treatment. Other materials and configurations can also be used.

The system 800 also includes a secondary optic 808. The secondary optic 808 is configured to guide the concentrated photonic energy 806 onto one or more photovoltaic (PV) cells 810, thus defining concentrated and guided photonic energy 812. The secondary optic 808 can be formed from any suitable material such as metal, glass, plastic, thermoplastic, and so on, and can bear any suitable reflective or dichroic surface treatment. In one or more examples, the secondary optic 808 is defined by a portion of a support element as described below. Thus, the secondary optic 808 is depicted as a discrete entity in the interest of clarity.

The system 800 also includes a first support 814 and a second support 816. The first and second supports 814 and 816 can be respectively formed from any suitable electrically conductive material such as aluminum, copper, brass, gold, and so on. Other materials can also be used. The first and second supports 814 and 816 hold the PV cells 810 in position relative to the primary optic 802 and the secondary optic 808 so as to receive the concentrated and guided photonic energy 812.

The first support 814 and the second support 816 are isolated against direct contact with each other, but are in direct electrical contact with the respective electrodes (e.g., 112 and 114) of the PV cells 810. Additionally, the first and second supports 814 and 816 function as buss-bars or electrical pathways for electrical current flow from the PV cells 810 to an electrical load 818.

The first support 814 and the second support 816 can hold the PV cells 810 in place by way of a clamping force, soldering, or a combination of these. In one example, the PV cells 810 are held in place by way of one or more electrically non-conductive jack screws (e.g., 118) that forcibly bias the first support 814 toward the second support 816. The PV cells 810 are removable from the immediately foregoing assemblage by loosening (manipulation) of the jack screws and can thus be service or replaced without unsoldering. Other configurations can also be used.

The system 800 further includes a heat transfer apparatus 820. The heat transfer apparatus 820 is in thermal communication with the first support 814 and is configured to reject heat from the PV cells 810 during normal operation. In one example, the heat transfer apparatus 820 is defined by a fan configured to drive a flow (e.g., F1) of ambient air through an internal passageway (e.g., 104) of the first support 814. In another example, the heat transfer apparatus 820 is defined by a source of pressurized nitrogen gas that flows through or around the first support 814. In yet another example, the heat transfer apparatus 820 is a heat sink thermally bonded to the first support 814 and configured to dissipate heat to the ambient environment by way of convention or radiation. Other forms of heat transfer apparatus 820 can also be used.

First Illustrative Method

Figure 9:
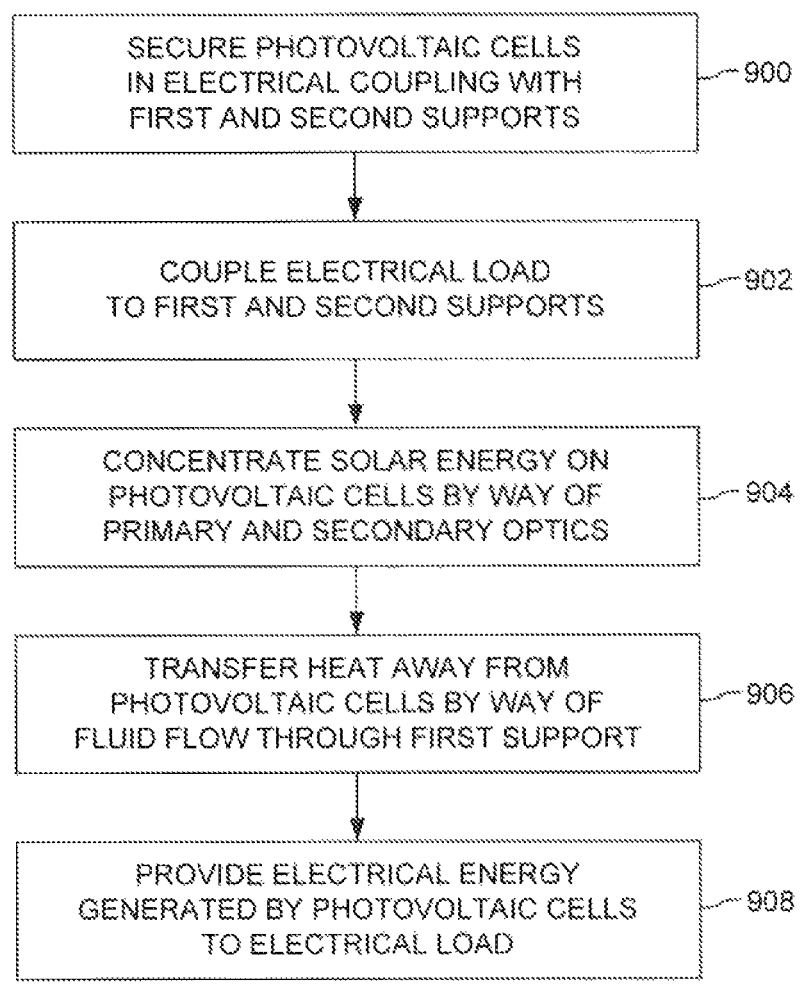
FIG. 9 depicts flow diagram of a method according to an example of the present teachings.

Reference is now made to FIG. 9, which depicts a flow diagram of a method according to another example of the present teachings. The method of FIG. 9 includes particular steps and proceeds in a particular order of execution. However, it is to be understood that other respective methods including other steps, omitting one or more of the depicted steps, or proceeding in other orders of execution can also be used. Thus, the method of FIG. 9 is illustrative and non-limiting with respect to the present teachings. Reference is also made to FIGS. 5 and 8 in the interest of understanding the method of FIG. 9.

At 900, one or more photovoltaic cells are secured in electrical coupling with first and second supports. For purposes of a present example, a number of PV cells 504 are placed in contact with a first support 506 and a second support 508 is disposed thereabout. A number of jack screws 509 then tightened so as to drive the first support 506 toward the second support 508. The PV cells 504 are now removably fixed (secured) in place and in electrical contact with the first and second supports 506 and 508.

At 902, art electrical load is coupled to the first and second supports. For purposes of the present example, the first and second supports 506 and 508 are electrically coupled to an electrical load 818. Thus, the first and second supports 506 and 508 are represented by the first and second supports 814 and 816, respectively.

At 904, solar energy is concentrated on the photovoltaic cells by way of primary and secondary optics. For purposes of the present example, a primary optic 516 concentrates solar energy (e.g., rays 522-526) toward a secondary optic 512. The secondary optic 512 guides the concentrated solar energy onto the PV cells 504.

At 906, heat is transferred away from the photovoltaic cells by way of a fluid flow through the first support. Within the present example, a flow (e.g., F1) of cooled air is forcibly driven or blown through an internal passageway 510 of the first support 506. This flow of chilled air is provided by a heat transfer apparatus 820 that is fluidly coupled to the first support 506. Heat is thus rejected from the PV cells 504 by way of the flow of chilled air.

At 908, electrical energy generated by the photovoltaic cells is provided to the electrical load. For purposes of the present example, the PV cells 504 generate an electrical potential (voltage) in response to the concentrated solar energy and a corresponding electrical current (amperage) is conveyed through the electrical load 818.

In general and without limitation, the present teachings contemplate various photovoltaic devices and systems and methods of their use. A device includes a first support and a second support, each formed from an electrically conductive material. At least a portion of the first support is received within a portion of the second support. That is, the first support is at least partially surrounded by the some portion of the second support.

One or more photovoltaic cells are secured in place with respect to the first and second conductive supports by way of a clamping force, soldering, conductive adhesive, or some combination of these. Positive and negative electrodes of the photovoltaic cells are electrically coupled to respective ones of the first and second supports such that the first and second supports serve as electrical buss-bars. The first and second supports are isolated against direct, electrical-shorting contact with one another by way of non-conductive isolators, jack screws, and the like.

A primary optic concentrates solar energy and such concentrated energy is guided onto the photovoltaic cells by way of secondary optic. The secondary optic can be defined by respective portions of the second or first support. Additionally, the first support functions to reject heat away from the photovoltaic cells by way of direct thermal conduction, or by thermal convection using a fluid flow through an internal passageway. Such a heat-rejecting fluid flow can be by way of forced ambient air flow, a chilled gas or liquid flow through a heat exchanger, by way of one or more heat sinks, and so on.

The present teachings, thus contemplate various solar energy systems that can be readily assembled and dissembled for servicing and repair, replacement or upgrade of photovoltaic cells, and so on.

In general, the foregoing, description is, intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the art's discussed herein, and that the disclosed systems and methods will be incorporated into such future embodiments. In sum, it should be understood that the invention is capable of modification and variation and, is limited only by the following claims.

What is claimed is:

1. A device, comprising:
a photovoltaic cell having a first electrode and a second electrode of respectively opposite electrical polarities;
a first metallic support electrically coupled to the first electrode, the first metallic support configured to transfer heat away from the photovoltaic cell; and
a second metallic support electrically coupled to the second electrode, wherein the first metallic support and the second metallic support are electrical buss-bars of respective opposite polarities; and an electrically non-conductive jack screw within an aperture of the second metallic support;

wherein the first metallic support comprises an internal passageway configured to transfer heat away from the photovoltaic cell by way of a flow of fluid.

2. The device according to claim 1, the photovoltaic cell held in place with respect to at least the first metallic support or the second metallic support by way of a clamping force.

3. The device according to claim 2, including an electrically non-conductive isolator, wherein the clamping force is applied by way of the electrically non-conductive isolator and the electrically non-conductive jack screw.

4. The device according to claim 1, at least a portion of the first metallic support disposed within at least a portion of the second metallic support.

5. The device according to claim 1 further comprising at least one electrically non-conductive material disposed to isolate the first metallic support from the second metallic support.

6. The device according to claim 1, the first metallic support configured to transfer heat away from the photovoltaic cell by way of thermal conduction.

7. The device according to claim 1 further comprising an optical element to concentrate photonic energy onto the photovoltaic cell.

8. A method, comprising:

disposing a photovoltaic cell in clamped relationship with a first support and a second support using an electrically non-conductive jack screw, the first and second supports electrically coupled to respective electrodes of the photovoltaic cell, wherein the first support and the second support are electrical buss-bars of respective opposite polarities;

concentrating photonic energy onto the photovoltaic cell by way of a first optical element and a second optical element so as to generate electrical energy;

providing the electrical energy to a load by way of the first and second supports; and transferring heat away from the photovoltaic cells by way of at least the first support, wherein the first support comprises an internal passageway configured to transfer heat away from the photovoltaic cells by way of a flow of fluid.

* * * * *